(12) United States Patent
Bockelman et al.

(10) Patent No.: US 9,065,405 B2
(45) Date of Patent: Jun. 23, 2015

(54) COMPENSATING FOR NON-LINEAR CAPACITANCE EFFECTS IN A POWER AMPLIFIER

(71) Applicant: Avago Technologies General IP (Singapore) Pte. Ltd., Singapore (SG)

(72) Inventors: David E. Bockelman, Dripping Springs, TX (US); Vishnu Srinivasan, Austin, TX (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/301,465

(22) Filed: Jun. 11, 2014

(65) Prior Publication Data

US 2014/0295776 A1   Oct. 2, 2014

Related U.S. Application Data

(62) Division of application No. 12/080,066, filed on Mar. 31, 2008, now Pat. No. 8,787,850.

(51) Int. Cl.
| | |
|---|---|
| H04B 1/04 | (2006.01) |
| H01Q 11/12 | (2006.01) |
| H03G 3/00 | (2006.01) |
| H03F 1/08 | (2006.01) |
| H03F 1/14 | (2006.01) |
| H03F 3/19 | (2006.01) |
| H03F 3/24 | (2006.01) |
| H03F 3/30 | (2006.01) |
| H04B 1/40 | (2015.01) |

(52) U.S. Cl.
CPC .................. *H03G 3/00* (2013.01); *H03F 1/086* (2013.01); *H03F 1/14* (2013.01); *H03F 3/19* (2013.01); *H03F 3/245* (2013.01); *H03F 3/3022* (2013.01); *H03F 2200/451* (2013.01); *H03F 2203/30144* (2013.01); *H04B 1/40* (2013.01)

(58) Field of Classification Search
CPC .......... H03G 3/00; H03G 3/10; H03F 3/3022; H03F 2200/451; H03F 2203/30144; H03F 1/086; H03F 1/14; H03F 3/19; H03F 3/245; H04B 1/40
USPC ............. 455/501, 127.2, 114.1, 114.2, 114.3, 455/250.1, 115.1, 127.3, 63.1, 67.13, 455/67.11; 330/253, 285, 252, 254, 296, 330/292, 302; 375/345, 346
See application file for complete search history.

(56) References Cited

U.S. PATENT DOCUMENTS

| | | |
|---|---|---|
| 4,498,058 A | 2/1985 | Benrud |
| 4,580,111 A | 4/1986 | Swanson |
| 4,593,251 A | 6/1986 | Smith |

(Continued)

OTHER PUBLICATIONS

"AWT6278R, Help3 TM PCS/WCDMA 3.4 V/29.5 dBm, Linear Power Amplifier Module", *Anadigics, Data Sheet—Rev. 2.0*, Jan. 2007, pp. 1-8 Jan. 2007, 1-8.

(Continued)

*Primary Examiner* — Pablo Tran

(57) ABSTRACT

In one implementation, a power amplifier may include a gain device to receive an input signal and to output an amplified signal, and a compensation device coupled to the gain device to compensate for a change in a capacitance of the gain device occurring due to a change in the input signal. The power amplifier may be formed using a complementary metal oxide semiconductor (CMOS) process.

11 Claims, 10 Drawing Sheets

(56) References Cited

U.S. PATENT DOCUMENTS

| | | | |
|---|---|---|---|
| 4,680,559 | A | 7/1987 | Swanson |
| 5,424,680 | A | 6/1995 | Nazarathy et al. |
| 5,495,166 | A | 2/1996 | Alini et al. |
| 5,559,471 | A | 9/1996 | Black |
| 5,872,481 | A | 2/1999 | Sevic et al. |
| 6,055,278 | A | 4/2000 | Ho et al. |
| 6,069,525 | A | 5/2000 | Sevic et al. |
| 6,414,547 | B1 | 7/2002 | Shkap |
| 6,566,948 | B1 | 5/2003 | Braithwaite |
| 6,570,430 | B1 | 5/2003 | Zhou |
| 6,621,334 | B2 | 9/2003 | Ausserlechner et al. |
| 6,664,941 | B2 | 12/2003 | Itakura et al. |
| 6,724,253 | B2 * | 4/2004 | Hau et al. ............. 330/149 |
| 6,731,166 | B1 * | 5/2004 | Sabouri et al. ......... 330/124 R |
| 6,774,719 | B1 | 8/2004 | Wessel et al. |
| 6,809,587 | B2 | 10/2004 | Ghannouchi et al. |
| 6,828,858 | B2 * | 12/2004 | Larson et al. ............ 330/277 |
| 6,876,255 | B2 * | 4/2005 | Reber ..................... 330/252 |
| 6,885,239 | B2 | 4/2005 | Otaka |
| 6,996,379 | B2 * | 2/2006 | Khorram .................. 455/91 |
| 7,095,283 | B2 | 8/2006 | Kee et al. |
| 7,129,784 | B2 | 10/2006 | Bhatti et al. |
| 7,157,965 | B1 | 1/2007 | Kim |
| 7,202,736 | B1 | 4/2007 | Dow et al. |
| 7,215,196 | B2 | 5/2007 | Banba et al. |
| 7,215,206 | B2 | 5/2007 | Dupuis et al. |
| 7,332,961 | B2 | 2/2008 | Blednov |
| 7,385,447 | B1 | 6/2008 | Adar |
| 7,386,075 | B2 | 6/2008 | Mostov et al. |
| 7,425,871 | B2 | 9/2008 | Gao et al. |
| 7,729,672 | B2 | 6/2010 | Deng et al. |
| 7,768,350 | B2 * | 8/2010 | Srinivasan et al. ........ 330/253 |
| 7,894,772 | B2 | 2/2011 | Aoki |
| 7,936,217 | B2 * | 5/2011 | Deng et al. ............. 330/264 |
| 8,072,272 | B2 | 12/2011 | Zhao et al. |
| 8,395,448 | B2 | 3/2013 | Ivanov et al. |
| 8,779,857 | B2 | 7/2014 | Pletcher et al. |
| 2003/0181181 | A1 * | 9/2003 | Darabi .................. 455/250.1 |
| 2004/0075506 | A1 | 4/2004 | Welland et al. |
| 2006/0164164 | A1 | 7/2006 | Rogers et al. |
| 2006/0267689 | A1 | 11/2006 | Elmala et al. |
| 2007/0049215 | A1 | 3/2007 | Chen et al. |
| 2007/0066250 | A1 | 3/2007 | Takahashi et al. |
| 2007/0188229 | A1 | 8/2007 | Abdelli |
| 2008/0031382 | A1 | 2/2008 | Aoki |
| 2008/0063263 | A1 | 3/2008 | Zhang et al. |
| 2009/0243727 | A1 | 10/2009 | Bockelman et al. |
| 2011/0025422 | A1 * | 2/2011 | Marra et al. ............. 330/296 |

OTHER PUBLICATIONS

"International Search Report and Written Opinion of PCT/US2009/036465, dated Sep. 22, 2009".

"International Search Report of PCT/US2009/036473, dated Sep. 28, 2009".

"Korean Patent and Trademark Office, Office Action mailed Sep. 28, 2011 in Korean application No. 10-2010-7024421".

"Korean Patent Office, Office Action mailed May 18, 2012 in Korean application No. 10-2010-7024421".

"RF2173, 3V GSM Power Amplifier, Package Style; QFN, 16-Pin, 4×4", *RF Micro Devices, Inc.* 2006, pp. 1-14 2006, 1-14.

"State intellectual Property Office, P.R. China, Office Action and Search Report mailed Dec. 19, 2012 in Chinese application No. 200980111890.0".

"Taiwanese Patent Office, Office Action mailed Mar. 30, 2012 in Taiwanese application No. 98108015".

"U.S. Patent and Trademark Office, Non-Final Office Action dated May 27, 2010 issued in U.S. Appl. No. 12/082,311; along with a Reply to Office Action filed via EFS on Aug. 24, 2010".

"U.S. Patent and Trademark Office, Office Action mailed Jun. 26, 2012 and Reply filed Sep. 21, 2012 in U.S. Appl. No. 12/080,066".

"U.S. Patent and Trademark Office, Restriction Requirement dated Feb. 4, 2010 with Reply to Restriction Requirement filed on Feb. 23, 2010 in U.S. Appl. No. 12/082,311".

"U.S. Patent and Trademark Office, Restriction Requirement mailed Feb. 29, 2012 and Election filed on Mar. 20, 2012 in U.S. Appl. No. 12/889,890".

"U.S. Patent and Trademark Office, Restriction Requirement mailed Jan. 12, 2012 and Election filed on Feb. 7, 2012 in U.S. Appl. No. 12/578,838."

"U.S. Appl. No. 12/082,311, filed Apr. 10, 2008, entitled "Providing Pre-Distortion to an Input Signal," by David E. Bockelman, et al".

"What's Next in UMTS Front-Ends", *RF Micro Devices, Inc.*, 2007, pp. 1-2 2007, 1-2.

Palaskas, Yorgos et al., "A 5-GHz 20-dBm Power Amplifier With Digitally Assisted AM-PM Correction in a 90-nm CMOS Process", Aug. 2006, 1757-1763.

Wang, Chengzhou et al, "A Capacitance-Compensation Technique For Improved Linearity in CMOS Class-AB Power Amplifiers", Nov. 2004, 1927-1937.

Wang, Chengzhou at al., "A Nonlinear Capacitance Technique and Its Application to a CMOS Class AB Power Amplifier", 2001, 1-4.

Wu, Jiangfeng at al., "A Low-Noise Low-Offset Capacitive Sensing Amplifier for a 50-ug/Hz Monolith CMOS MEMS Accelerometer", May 2004, 722-730.

\* cited by examiner

COMPENSATING FOR NON-LINEAR CAPACITANCE EFFECTS IN A POWER AMPLIFIER

CROSS-REFERENCE TO RELATED APPLICATIONS

The present application is a divisional application under 37 C.F.R. §1.53(b) of U.S. patent application Ser. No. 12/080,066 filed on Mar. 31, 2008, naming David E. Bockelman as inventor. Priority under 35 U.S.C. §120 is claimed from U.S. patent application Ser. No. 12/080,066, and the entire disclosure of U.S. patent application Ser. No. 12/080,066 is specifically incorporated herein by reference.

BACKGROUND

In various circuitry, amplifiers are commonly used to boost an amplitude of an incoming signal to a desired level. For example, various amplifiers may be present in a given system to boost signal strength of incoming signals to provide them at a desired level for further processing.

In wireless systems such as cellular handsets, mobile internet devices, wireless personal digital systems (PDAs) and so forth, typically a power amplifier (PA) is present to receive a radio frequency (RF) signal modulated as desired for a given communication protocol and amplify this signal for transmission via an antenna of the device. Typically, a power amplifier can amplify both current and voltage of an incoming signal to provide the signal at a desired level.

Different requirements may exist in different communication protocols. Many communication systems have various requirements for a handset to achieve with relation to power, efficiency, and linearity over varying signal levels. For example, a variety of communication systems, including enhanced data rates for GSM evolution (EDGE), long term evolution (LTE/4G), WiFi in accordance with an IEEE 802.11 standard worldwide interoperability for microwave access (WiMax), code division multiple access (CDMA), and wideband-code division multiple access (W-CDMA) all have modulation schemes that require a linear signal path.

In an amplifier stage of such a PA, it a phase shift through the stage is a function of the amplitude of the input signal, then that amplifier has phase distortion (a.k.a. amplitude modulation-to-phase modulation (AM-to-PM) distortion). AM-to-PM distortion is a non-linear process which degrades the amplifier's overall linearity. AM-to-PM distortion can exist with or without amplitude (a.k.a., AM-to-AM) distortion. Together the two non-linear processes characterize the non-linear behavior that is relevant in ideally linear communications circuits. These non-linear processes cause spectral splatter or leakage of signal energy from a desired channel to nearby channels. In many systems, this spectral splatter is measured by the adjacent channel power ratio (ACPR) or the adjacent channel leakage ratio (ACLR).

Current PAs are typically formed using a gallium arsenide (GaAs) process with bipolar devices that do not suffer significant AM-to-PM distortion. However, in the case of highly efficient complementary metal oxide semiconductor (CMOS) power amplifiers, AM-to-PM distortion can cause a significant linearity problem. AM-to-AM linearization techniques exist for CMOS devices, but such techniques either do not address AM-to-PM distortion, or they are rendered less effective because of AM-to-PM distortion. As a result, an amplifier such as a power amplifier that is formed using CMOS devices can have linearity issues. Alternatively, the CMOS power amplifier can be made to operate in a different mode (a.k.a. Class A) that improves the overall linearity but reduces the efficiency.

DETAILED DESCRIPTION

Embodiments may be used to improve linearity of an amplifier, and more particularly to improve phase linearity of a PA such as a CMOS PA. However, the techniques described herein may be used to improve linearity of CMOS devices in circuits beyond PAs. As will be described further below, embodiments may improve linearity by compensating for capacitance changes that occur to a device as it is provided with varying input signal levels. More specifically, as transistors dynamically change their characteristics when conducting in different operating regions, different inherent or parasitic capacitances may exist. Embodiments may attempt to reduce or remove the effects of such capacitance changes.

In a CMOS gain stage such as used in a PA, MOS devices can be configured as a complementary common-source amplifier in which multiple metal oxide semiconductor field effect transistors (MOSFETs), namely a p-channel MOSFET (PMOS) and an n-channel MOSFET (NMOS), are driven at the gates by an incoming signal and have their drain terminals coupled together to provide an amplified version of the input signal. In this case, the gate-to-source capacitance ($C_{gs}$) of the NMOS and PMOS devices are the main source of AM-to-PM distortion. This is caused by the significant change in $C_{gs}$ as the input signal amplitude ($V_{gs}$) increases. For a high efficiency PA, a gain stage is typically biased Class AB or B, where the MOS devices are nearly off. As the input signal RMS value increases to a larger level than the quiescent, the devices' average operating point is shifted to a more "on" condition. This shifting operating condition causes a change in the devices' channel charge, and hence a change in the average $C_{gs}$.

This capacitance change typically happens near the threshold voltage of the devices, where they begin to conduct significantly. For example, if a device is instantaneously off at a point in time and there is no current through the device, a channel has no significant charge, and thus the capacitance seen on the input to a very small signal is also very small. When an input voltage starts to swing upwards and starts to turn the device on, the device starts to conduct, and the channel begins to gain some charge in it, and the device essentially acts like parallel plates such when there is no charge in a channel, the plates are far apart, but as a charge begins to build in the channel, the plates become closer together. Thus as the device turns on, the plates come closer together and capacitance increases rapidly.

Figure 1:
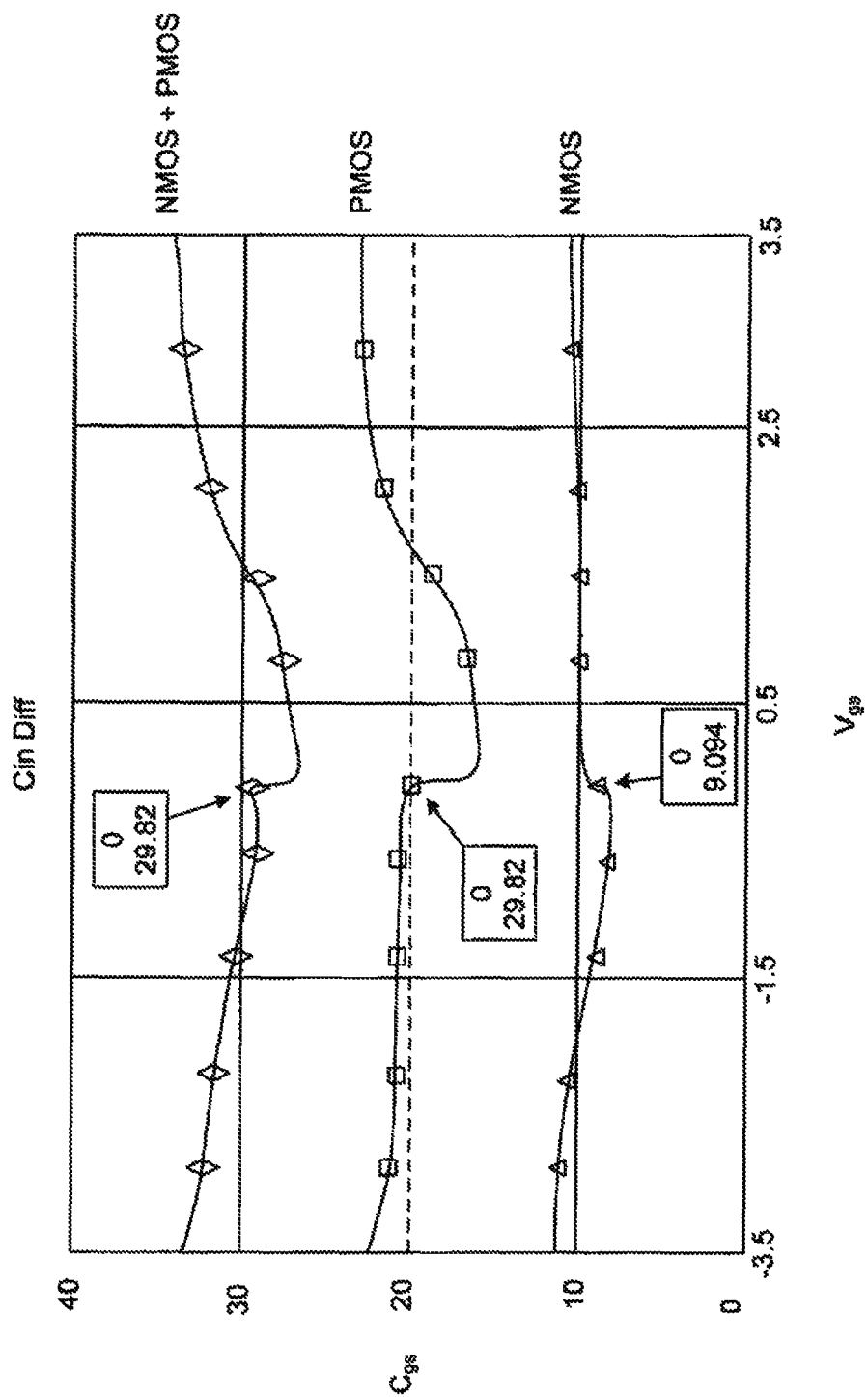
FIG. 1 is a graphical illustration of capacitance changes versus a gate-to-source voltage.

Referring now to FIG. 1, shown is a graphical illustration of small-signal capacitance changes occurring over a corresponding change in bias voltage (a.k.a. operating point). Specifically, FIG. 1 shows capacitance changes for a NMOS device and a PMOS device as the $V_{gs}$ for these devices varies. As shown in FIG. 1, while the capacitance of each device does vary over $V_{gs}$, note that a rapid change occurs at a $V_{gs}$ level substantially around a threshold voltage level of the given device. FIG. 1 also shows the combined capacitance changes of the two devices, which corresponds to total input capacitance for the NMOS $C_{gs}$ and the PMOS $C_{gs}$. Thus FIG. 1 shows the capacitance change of a small signal $C_{gs}$ versus a DC bias value ($V_{gs}$) for individual NMOS and PMOS devices, as well as a total input capacitance for the NMOS $C_{gs}$ and the PMOS $C_{gs}$.

Consider a sinusoidal input signal, $V_{gs}$. Conceptually, as the instantaneous voltage changes, the input capacitance also changes. Thus, the input signal traces a path on a capacitance vs. voltage plot diagram such as that of FIG. 1. As the peak voltage of the sine wave increases, the capacitance wave changes significantly. For a given $V_{gs}$ amplitude, the time-average value of the capacitance wave is the critical quantity for AM-to-PM distortion. As the time-average $C_{gs}$ with input amplitude, the phase shift of the gain stage will change. It is this phase change that gives rise to AM-to-PM distortion.

Figure 2A:
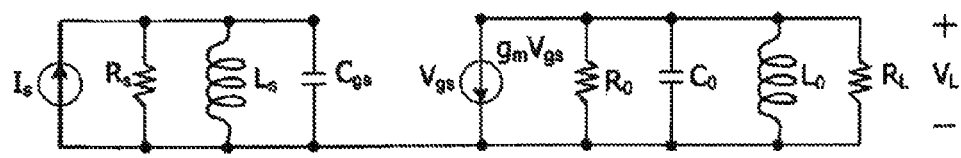
FIG. 2A is a small signal model of a CMOS gain stage.

The functional relation of the phase shift to the change in $C_{gs}$ can be determined using a small signal model of a gain stage. Referring now to FIG. 2A, shown is a small signal model of a CMOS gain stage coupled between a source, represented as a current source $I_S$, a source resistance $R_S$ and a source inductance $L_S$, and a load. The small signal model of the gain stage itself is represented as a capacitance, $C_{gs}$, a current source of $gmV_{gs}$ and an output resistance, capacitance, and inductance ($R_O$, $C_O$, $L_O$), which is coupled to a load, represented by a load resistance $R_L$. Let $R_S$ include in losses from $L_S$ (in parallel form). $C_{gs}$ equals $C_{gs0}$ and $\Delta C_{gs}$, where $C_{gs0}$ is the small-signal input capacitance. $L_S$ is resonant with $C_{gs0}$ at the center frequency, $\omega_o$. $R_L$ includes loss from $L_O$ and $R_O$, and $L_O$ is resonant at the center frequency with $C_O$.

Figure 2B:
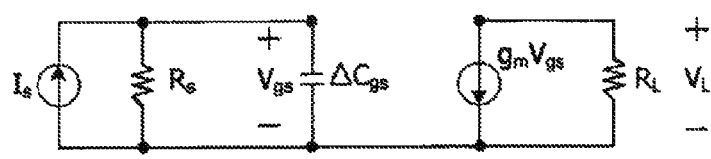
FIG. 2B is a small signal model of a CMOS gain stage operating at a center frequency.

Note that in this small signal model, at frequencies near a center frequency, which may correspond to a center frequency at which the gain device operates, e.g., a center frequency of a RF frequency of a given communication system (e.g., a 1800 megahertz (MHz)), the small signal model of FIG. 2A may be represented by the small signal model set forth in FIG. 2B. With reference to the small signal model of FIG. 2B, near a center frequency $\omega=\omega_o$, $$\Delta \text{ Phase Shift} = \angle V_L/I_S = -\tan^{-1}(\omega \Delta C_{gs} R_s) \approx -\omega \Delta C_{gs} R_s$$

$$\therefore \Delta\Phi = -\tan^{-1}(\omega \Delta C_{gs} R_s) \approx -\omega \Delta C_{gs} R_s.$$

Extracting the total input capacitance under large-signal conditions, the (uncompensated) capacitance decreases at medium input levels. In an example system, assume a $\Delta Cgs \approx -1.8$ picoFarads (pF), with $R_S=100\Omega$ and a 900 MHz center frequency, the phase shift is approximately 45°, which can cause significant phase distortion.

To reduce or prevent such phase distortion, an open-loop compensation approach can be provided, in various embodiments. More particularly, embodiments may use a complementary device as a capacitor that compensates him the change in $C_{gs}$ of the gain device. For compensation to be effective, the compensation device area can be scaled with reference to the gain device area so that changes in capacitance in a rapid transition region are approximately equal. As used herein, the tem "rapid transition region" refers to a portion of a signal range (either as a function of input signal, $V_{gs}$, or other voltage level) at which rate of the capacitance change is substantially higher than at other portions of the voltage level. This region is related to a threshold voltage of the device, and thus the rapid transition region may also be used to refer to the devices themselves.

A compensation bias source can be set so that the rapid transition regions (for gain device and compensation device) align with respect to input voltage. In some implementations, the compensation device can be approximately half the area of the gain device, and the corresponding compensation bias can be approximately $V_{DD}-V_{TN}-|V_{TP}|$, where $V_{DD}$ is supply voltage and $V_{TN}$ and $V_{TP}$ are threshold voltages for the NMOS and PMOS devices, respectively.

Figure 3A:
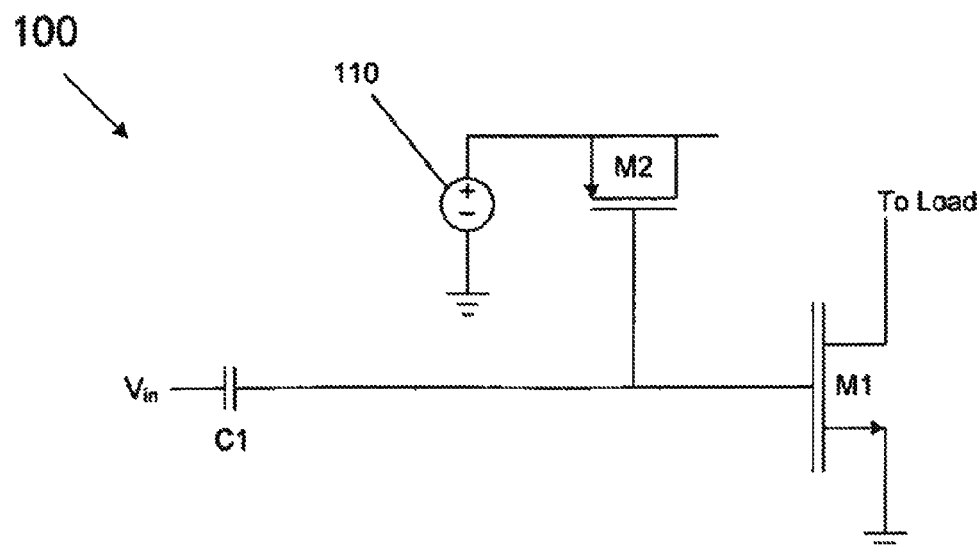
FIG. 3A is a schematic diagram of a compensation circuit in accordance with one embodiment of the present invention.

Referring now to FIG. 3A, shown is a schematic diagram of a compensation circuit in accordance with one embodiment of the present invention. As shown in FIG. 3A, circuit 100 may be part of a gain stage of a power amplifier. More specifically, as shown in FIG. 3A, circuit 100 includes an amplifier formed of a MOSFET M1 which as shown is an NMOS device. As shown in FIG. 3A, circuit 100 may be coupled to receive an incoming signal $V_{in}$ through a capacitor C1 that acts as a DC block to thus couple an incoming AC signal, which may be an RF signal to be amplified to output from a handset or other wireless device, to MOSFET M1. While shown with this simple capacitance block, understand that in various implementations a large variety of coupling approaches can be used. As shown in FIG. 3A, this input signal is coupled to transistor M1, and more specifically to a gate terminal of the device. MOSFET M1 may be a common-source amplifier having a source terminal coupled to a reference voltage (e.g., a ground voltage) and a drain terminal coupled to a supply voltage through a biasing network, or to a drain terminal of a PMOS device (in a complementary implementation), to thus provide an amplified output signal to a load to which the gain stage is coupled. While not shown in the embodiment of FIG. 3A, understand that an output line coupled to the drain terminal of MOSFET M1 may provide the amplified signal to a further portion of a signal path of the power amplifier, e.g., to another gain stage, to an output matching network or so forth.

Figure 4A:
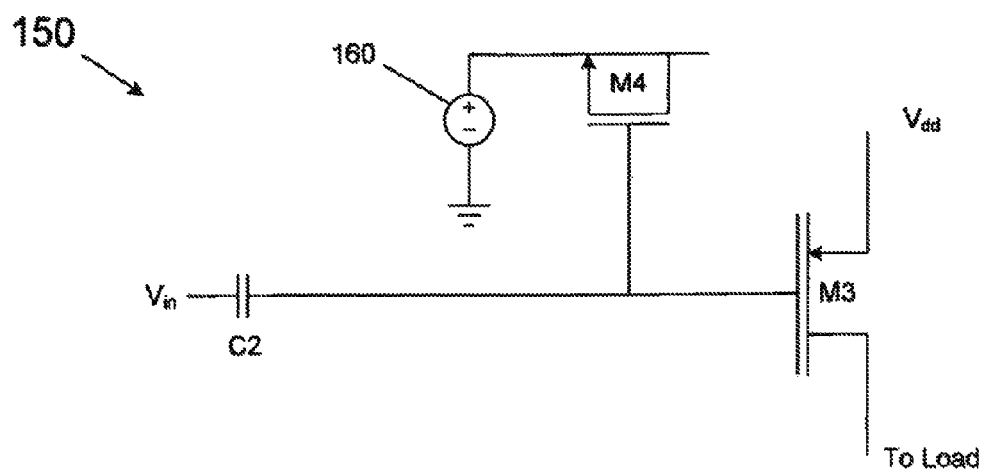
FIG. 4A is a schematic diagram of a compensation circuit in accordance with another embodiment of the present invention.

Still referring to FIG. 3A, to provide for open-loop compensation a second MOSFET, namely MOSFET M2, may be coupled to MOSFET M1. Specifically, as shown in FIG. 3A MOSFET M2 may be a so-called gate capacitor or MOS capacitor, formed of a MOSFET having source and drain terminals coupled together to act as a plate of the capacitor. Note that MOSFET M2 may be of complementary design, i.e., at opposite polarity to MOSFET M1 to thus provide the desired capacitance compensation. In the embodiment of FIG. 3A, MOSFET M2 may be a PMOS device. Note that in the embodiment of FIG. 3A, a bias source 110 is coupled to provide a bias voltage to the commonly coupled source and drain terminals, and the gate of MOSFET M2 is coupled to the gate of MOSFET M1. While shown in the embodiment of FIG. 3A as an NMOS device, understand that in other implementations an amplifier may be formed of a PMOS device with a corresponding NMOS compensation device, as shown in FIG. 4A below. Still further, as will be described below, an amplifier may be formed of complementary NMOS and PMOS devices coupled together. Furthermore, while shown with a single-ended implementation for ease of discussion in FIG. 3A, understand that various embodiments may have a differential design, and also in various implementations multiple gain devices may be coupled together in cascade fashion such that the input capacitance compensation may be applied to one or more of such gain devices. Still further, parallel gain stages may be present in some implementations. In some implementations, both input and output compensation devices may be present.

For example, such parallel gain stages may each be of a different size and each may be biased differently. In such an implementation, each gain device may have a capacitance compensation applied as described above. Each compensation device may similarly be biased with a different bias voltage. In this way, with the differently-valued bias sources both for gain devices and compensation devices, the transition region of the capacitance change can be effectively spread out. In yet other embodiments, the multiple parallel gain stages can be biased at the same point or at very different points (i.e., some on and some off). In each case, a compensation device can be separately applied to each parallel path and the compensation bias may be set for the corresponding gain device to which it is coupled.

Still further, a single gain stage may have multiple compensation devices connected in parallel thereto, with each such compensation device biased at slightly different points to thus spread out the non-linearity, and thus to spread out the transition region of the capacitance change.

The bias voltage for a compensation device may be set to track any changes in the gain device's bias, supply voltage, temperature, and process variations. The basic dependencies for the bias voltage for compensation can be understood by considering the physical processes that lead to the capacitance changes. For an NMOS device, as $V_{gs}$ increases from 0, while $V_{ds} > 0$, a channel is formed wider the gate. This formation leads to a rapid increase in $C_{gs}$ with respect to $V_{gs}$ as the separation between capacitor plates is reduced. The device's $V_T$ determines the amount of charge in the channel for a given $V_{gs}$, which influences $C_{gs}$. Thus, $V_T$ strongly influences the value $V_{gs}$ at which $C_{gs}$ goes through a rapid transition.

Likewise, the $V_T$ of a PMOS gain device determines the value of at which the $C_{gs}$ of the gain device makes its rapid transition. Since the $V_{gs}$ of the PMOS gain device is referenced to the supply voltage ($V_{DD}$), the bias voltage for compensation may also be function of $V_{DD}$. As described above, in some implementations, the bias voltage is approximately $V_{DD} - |V_{TP}| - V_{TN}$. Note that by shifting the burden of this bias generation design from RF to DC, many advantages appear, such as more design flexibility and easier implementation.

Figure 3B:
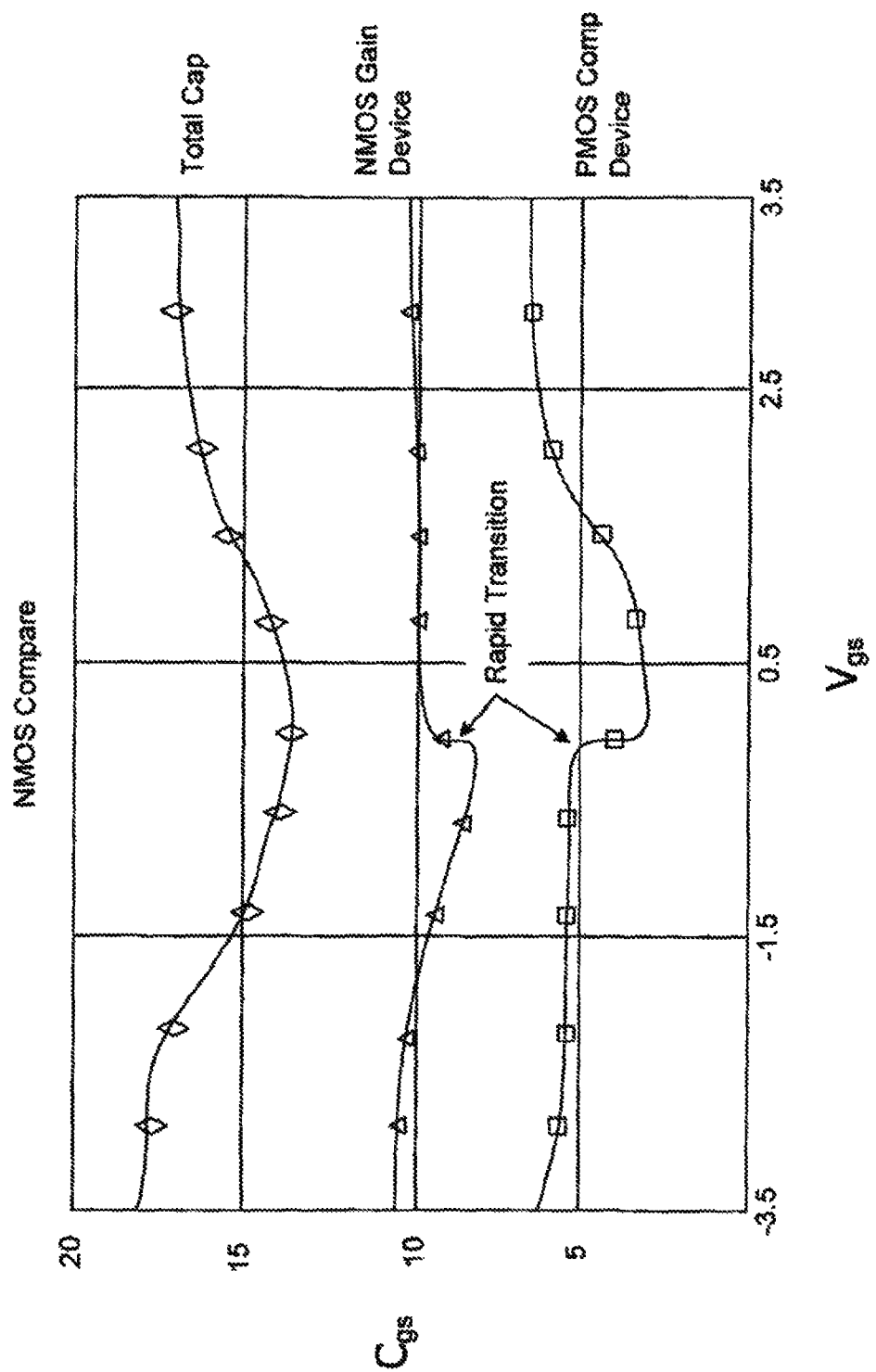
FIG. 3B is a graphical illustration of capacitance changes for the circuit of FIG. 3A.

Referring now to FIG. 3B, shown is a graphical illustration of capacitance changes (i.e., $\Delta C_{gs}$) that occur over changing input signal conditions (i.e., $\Delta V_{gs}$) for the circuit of FIG. 3A. Specifically, note that the NMOS gain device undertakes a large, rapid capacitance change substantially around a threshold voltage of the device, i.e., the rapid transition region. To thus compensate for this change, the PMOS compensation device may undergo an opposite and substantially equal capacitance change around this same value of the incoming signal. Thus as shown in the top curve of FIG. 3B, the total capacitance change that occurs is much smoother, with a significantly reduced rate of change of $C_{gs}$, improving phase linearity of the gain device. Note that even though the maximum change in capacitance before and after compensation is about the same, the compensated capacitance characteristic results in improved linearity. Thus what essentially provides the phase-linearity improvement is the slope reduction of the capacitance characteristic.

Figure 3C:
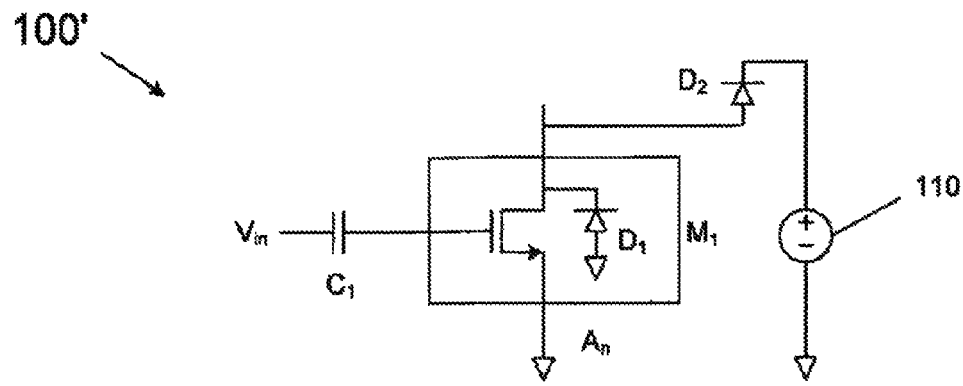
FIG. 3C is a schematic diagram of a compensation circuit in accordance with another embodiment of the present invention.

In some embodiments, there may be a variable capacitance on an output node of the gain device, which may be coupled from the drain to the source of the gain device and is variable. In this alternate embodiment, a complementary depletion capacitance may be coupled to compensate the output of the gain device for the capacitance change. Specifically, as shown in FIG. 3C, a circuit 100' may include a gain device M1 driven at the gate by an incoming signal that is AC coupled through a coupling capacitance C1. The box enclosing the NMOS gain device M1 also shows an inherent parasitic diode D1 that is formed at the drain terminal of the gain device. This diode is of the type N+:P-well, where the N+ corresponds to the drain diffusion, and the P-well is the other terminal of the diode. To provide for output capacitance compensation, a similar diode structure D2 may be realized by a diffusion in a P-well and connected to an appropriate bias source 110 as shown in the FIG. 3C. It is noted that other diodes structures can also be used. If the NMOS drain area is $A_n$, then the diode will have an area that is appropriately scaled: $C \times A_n$ such that the total capacitor (which is the sum of the intrinsic drain diode of the NMOS gain device and the compensation diode) variation as a non-linear function of the output signal levels (which hi turn depends on the input signal levels) is minimized.

Figure 3D:
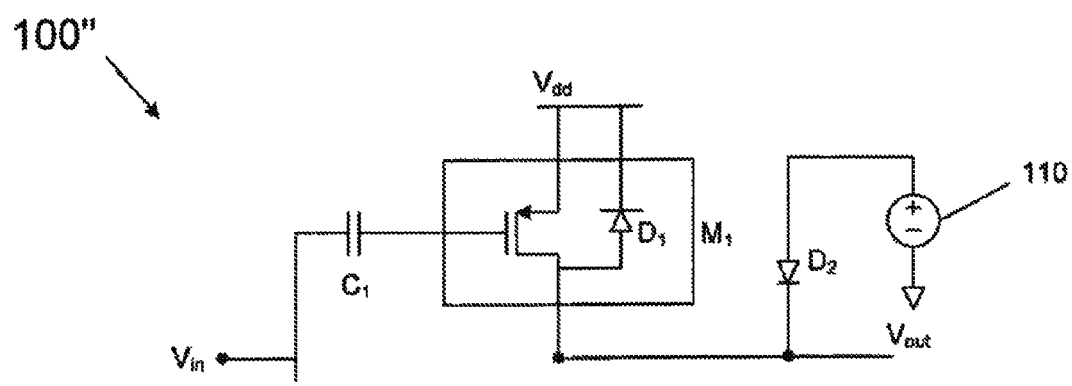
FIG. 3D is a schematic diagram of a dual circuit to the compensation circuit of FIG. 3C.

FIG. 3D is a schematic diagram of a dual circuit to the compensation circuit of FIG. 3C. Specifically, FIG. 3D shows a circuit 100'' that includes a PMOS gain device M1 having, an inherent parasitic diode 101 that is a P+ type N-well diode, while compensation diode D2 is formed as an P+ diffusion in a N-well connected to bias source 110.

Figure 3E:
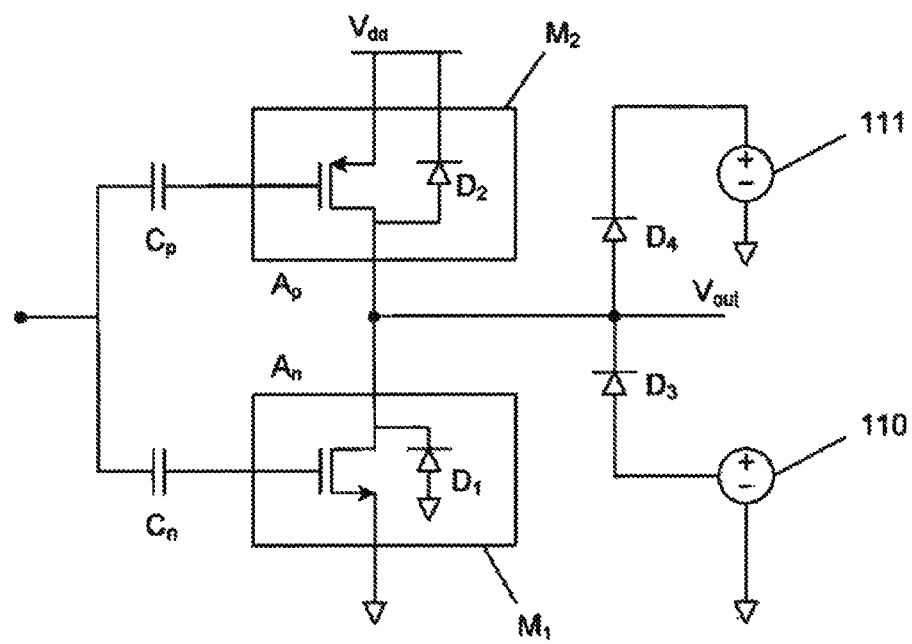
FIG. 3E is a schematic diagram of a complementary compensation circuit in accordance with one embodiment of the present invention.

In yet other implementations, a complementary version including both NMOS and PMOS devices, such as of a complementary gain stage may be provided. Referring now to FIG. 3E, shown is a schematic diagram of a CMOS embodiment. As shown in FIG. 3E, circuit 100''' includes an NMOS gain path AC coupled through a coupling capacitance $C_N$ and a PMOS gain path AC coupled through a coupling capacitance $C_P$. Complementary gain devices M1 and M2 thus provide an output signal $V_{out}$ that is compensated by output compensation diodes D3 and D4, which are each coupled between the commonly coupled drain terminals of gain devices M1 and M2 and corresponding bias sources 110 and 111.

Figure 4B:
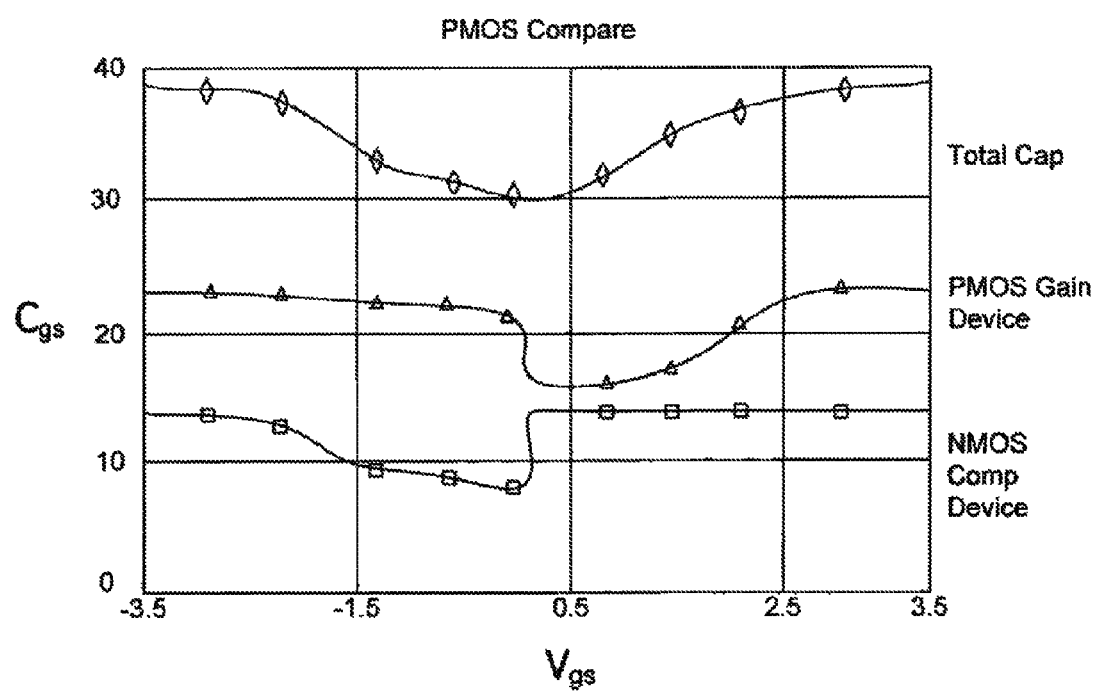
FIG. 4B is a graphical illustration of capacitance changes for the circuit of FIG. 4A.

FIG. 4A shows a similar amplifier to that of FIG. 3A, but having a PMOS gain device. Specifically, as shown in FIG. 4A, circuit 150 may be part of a gain stage of a power amplifier, and includes a MOSFET M3 which as shown is a PMOS device having a source terminal coupled to a supply voltage and a drain terminal to provide an amplified version of an incoming signal to a load to which the gain stage is coupled. Circuit 150 may be coupled to receive an incoming signal $V_{in}$ through a capacitor C2 that acts as a DC block, to thus couple an incoming AC signal, which may be an RF signal to be amplified to MOSFET M3. While shown with this simple capacitance block, understand that in various implementations, a large variety of coupling approaches can be used. A second MOSFET, namely MOSFET M4, may be coupled to MOSFET M3. Specifically, MOSFET M4 may be a MOS capacitor with commonly coupled source and drain terminals. Note that MOSFET M4 is a NMOS device. A bias source 160 is coupled to provide a bias voltage to these commonly coupled source and drain terminals, and the gate of MOSFET M4 is coupled to the gate of MOSFET M3. Circuit 150 may operate in complementary fashion to that of circuit 100 of FIG. 3A. FIG. 4B shows a graphical illustration of capacitance changes for the circuit of FIG. 4A.

To expand the concept of capacitance compensation set forth in FIGS. 3A and 4A to a complementary amplifier, the NMOS and PMOS gain devices of the figures may have their drain terminals coupled together such that the circuitry present in these figures is combined to provide for complementary operation.

Figure 5:
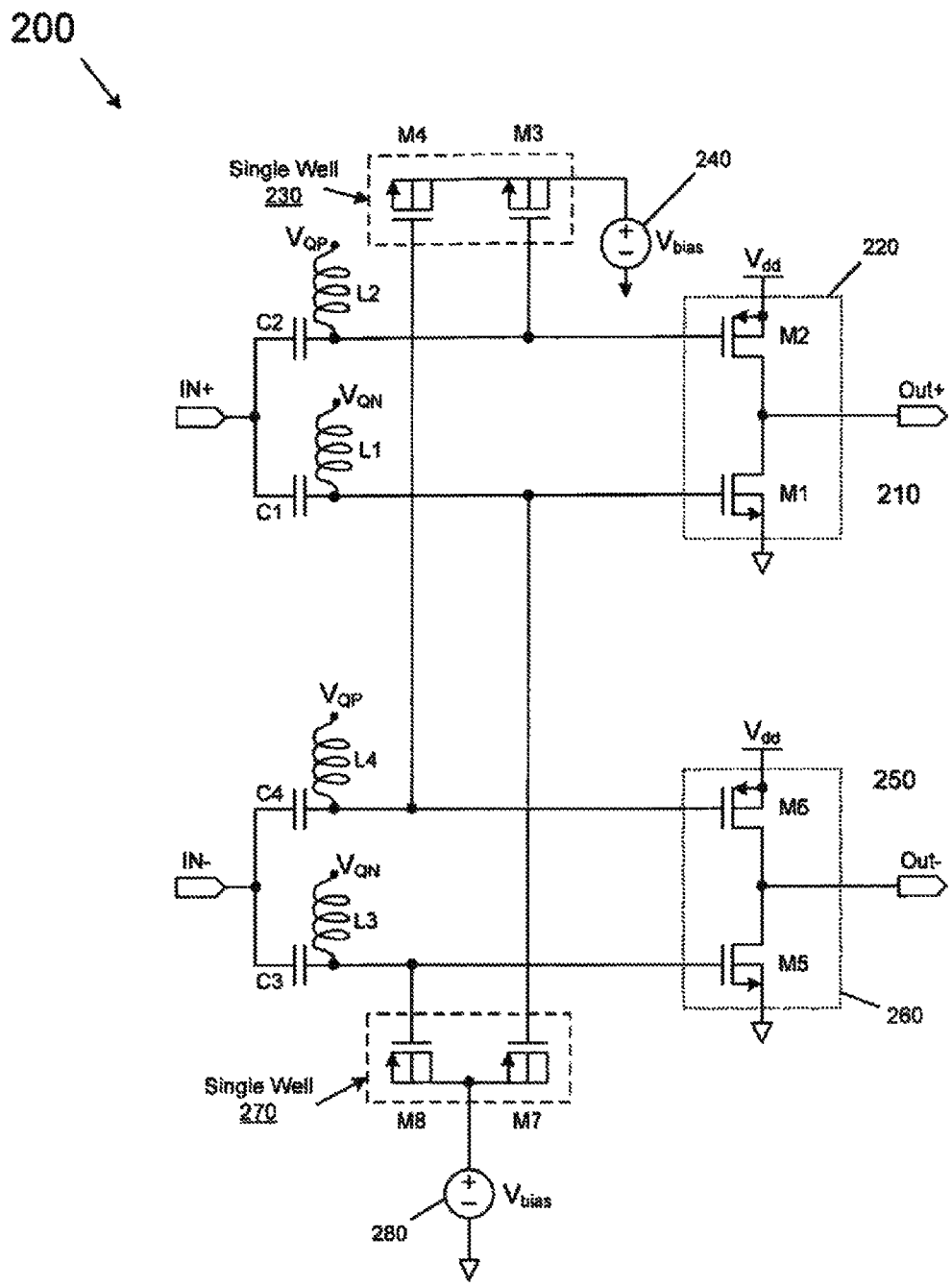
FIG. 5 is a conceptual schematic diagram of a compensation circuit in accordance with another embodiment of the present invention.

Referring now to FIG. 5, shown is a schematic diagram of a compensation circuit in accordance with another embodiment of the present invention. As shown in FIG. 5, circuit 200 may be differential amplifier having a positive portion (or p-side) 210 coupled to receive a positive portion plan incoming differential signal, In+, and a negative portion (or n-side) 250 coupled to receive a negative portion of the differential signal, In−. These signals may be driven (ideally) with equal amplitudes of 180° phase difference.

As shown in FIG. 5, first portion 210 includes a gain stage 220 and second portion 250 includes a gain stage 260. In addition, two compensation stages 230 and 270 may be provided, each of which is coupled to parts of the first and second portions, as will be described further below. As shown in the embodiment of FIG. 5, gain stage 220 includes a pair of complementary MOSFETs M1 and M2. In turn, gain stage 260 includes complementary MOSFETs M5 and M6. These gain stages are coupled to receive respective incoming signals at their gate terminals through a DC block formed of capacitors C1-C4. Still further, a bias voltage is supplied via these capacitors and inductors L1-L4, coupled between the input lines and respective bias voltages $V_{QP}$ and $V_{QN}$, to provide a bias voltage for these gain stages. Of course, other coupling and biasing approaches exist and may instead be used.

Compensation stages 230 and 270 are provided to improve phase linearity by decreasing the rate of a capacitance change occurring around the threshold voltages of the devices that form the gain stages. As shown, compensation stage 230 is formed of a pair of NMOS transistors M3 and M4, both of which have source and drain terminals coupled to a bias voltage obtained from a bias generator 240. In turn, gate terminals of these devices are differentially driven by the input signals to the PMOS devices of gain stages 220 and 260, namely MOSFETS M2 and M6. Similarly, compensation stage 270 is formed of a pair of PMOS transistors M7 and M8, both of which have source and drain terminals coupled to a bias voltage obtained from a bias generator 280. In turn, gate terminals of these devices are differentially driven by the input signals to the NMOS devices of gain stages 220 and 260, namely MOSFETS M1 and M5.

Note that bias generators 240 and 280 may be set at approximately the same bias level. Further, in some implementations only a single bias source may be provided and coupled to all compensation devices, although for certain implementations, providing separate bias generators for the different compensation stages may ease layout and routing issues. Thus in circuit 200, the differential output signal, Out+/−obtained at the common drain terminals of the complementary devices of each gain stage is provided with greater linearity across its operating range.

For proper bias, the bulk of the compensating devices are DC isolated from other devices. In various CMOS processes a deep N-well may be provided for the NMOS compensation devices. As shown in FIG. 5, in a differential application, there are four compensation devices for the differential amplifier: two NMOS compensation devices (M3 and M4) driven differentially and two PMOS compensation devices (M7 and M8) driven differentially. By placing each pair of compensation devices close together in the same well, biasing of the well and bulk is more practical. This is because the two devices are driven differentially, and the return current of one device is through the second device, thus eliminating large currents through the bulk, which greatly simplifies a given bias implementation. That is, by providing a pair of compensation devices differentially driven, the biasing of the bulk becomes easier. In this way, the signal current does not leak off elsewhere, causing complications. This also eases the design of the bias source, as it does not need to provide the large signal currents, and hence can be implemented in small area with very little power consumption.

Figure 6A:
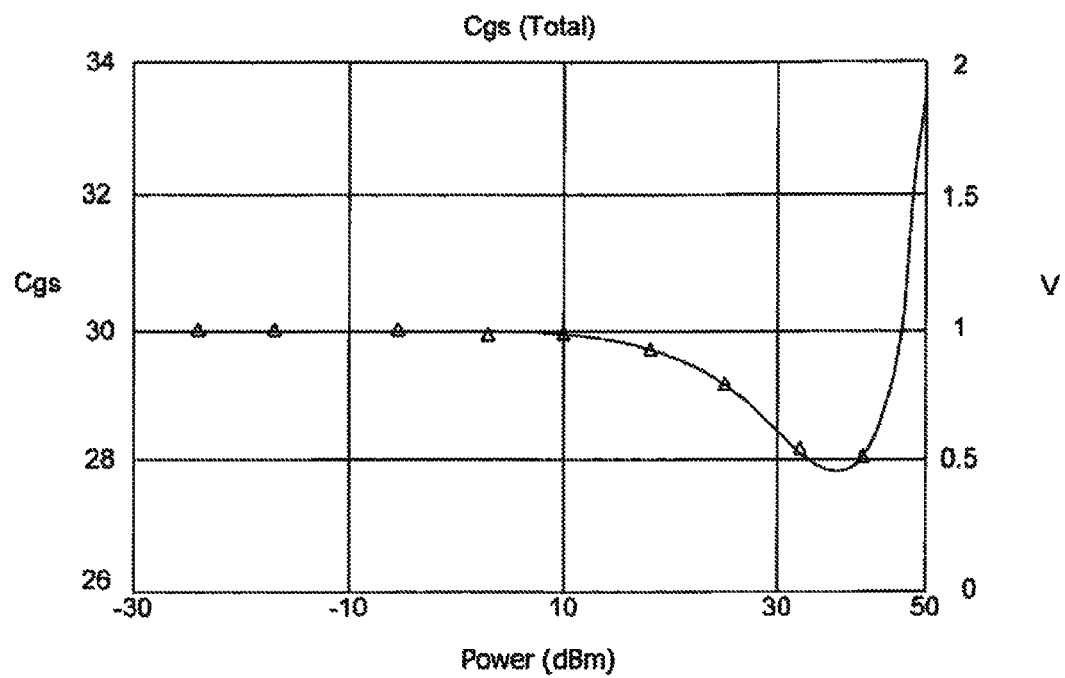
FIG. 6A is a graphical illustration of capacitance changes without compensation in accordance with an embodiment of the present invention.
Figure 6B:
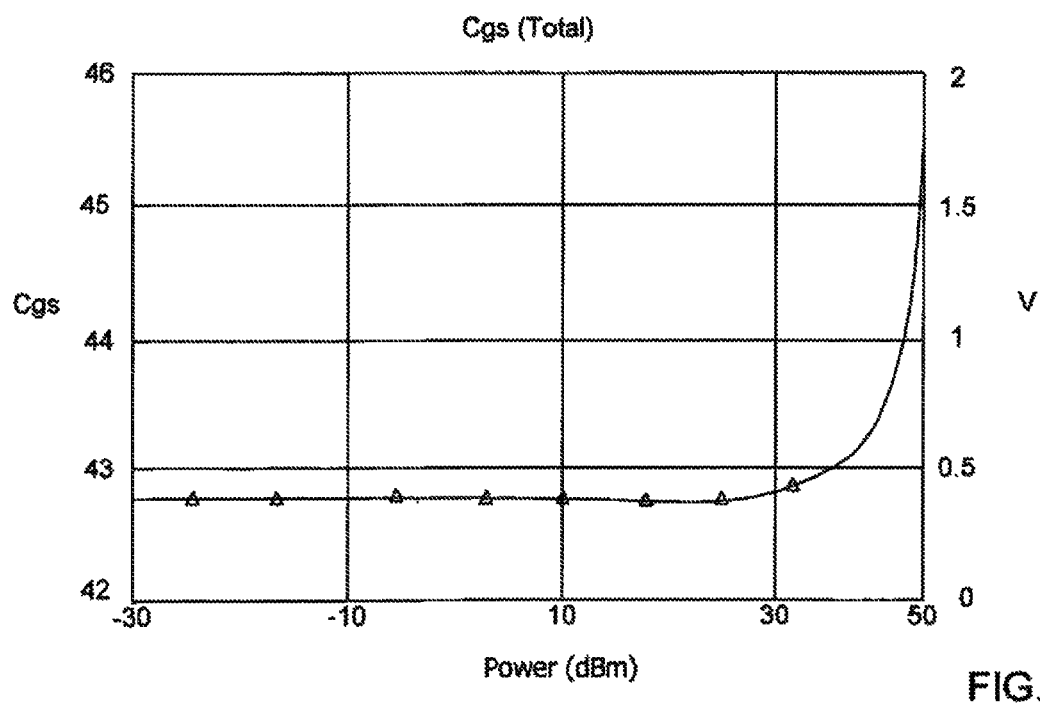
FIG. 6B is a graphical illustration of capacitance changes with compensation in accordance with an embodiment of the present invention.

Thus, by providing one or more compensation devices for a gain stage, reduced capacitance changes may occur, improving phase linearity. Referring now to FIG. 6A, shown is a graphical illustration of capacitance changes over varying RMS input levels over an operating region of an example PA, without capacitance compensation in accordance with an embodiment of the present invention. As shown in FIG. 6A, as input power (related to the RMS value of the input voltage) increases, a relatively large decrease in capacitance occurs at medium input-power levels. For example, as described above with regard to the small signal model, a change of approximately −1.8 pF can be realized at a medium input-power levels for a 900 MHz signal, leading to a phase change of approximately 45° without use of a compensation technique as disclosed herein. In contrast, using embodiments of the present invention such as that illustrated with circuit 200 of FIG. 5, over medium input-power levels, a substantially reduced capacitance change occurs, as shown in the graphical illustration of FIG. 6B. Thus it is noted that the total capacitance is no independent of $V_{gs}$, but the slope (max) has been significantly reduced. For example, see the slope differences between FIG. 1 (showing a significant slope change without capacitance compensation) and FIGS. 3B and 4B (showing a smooth change in total capacitance across differing $V_{gs}$ levels). With this compensation, a large-signal input shows significantly less variation in input capacitance in the medium-input power levels range. At the point of amplitude compression, and referring back to the same exemplary parameters discussed above, $\Delta C_{gs} \approx 0.08$ pF and the phase distortion is reduced to approximately 3°.

Figure 7A:
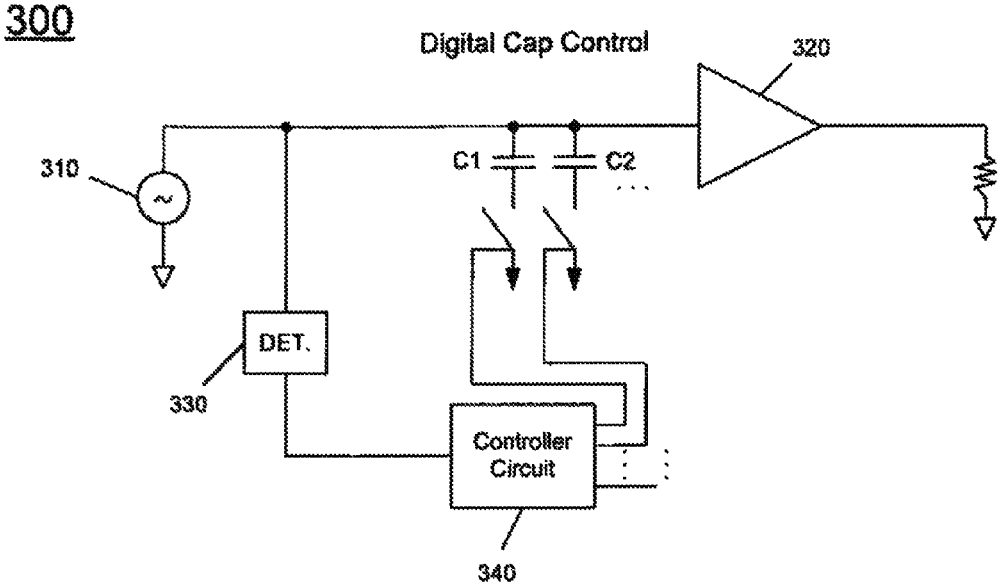
FIG. 7A is a schematic diagram of a closed loop system in accordance with one embodiment of the present invention.
Figure 7B:
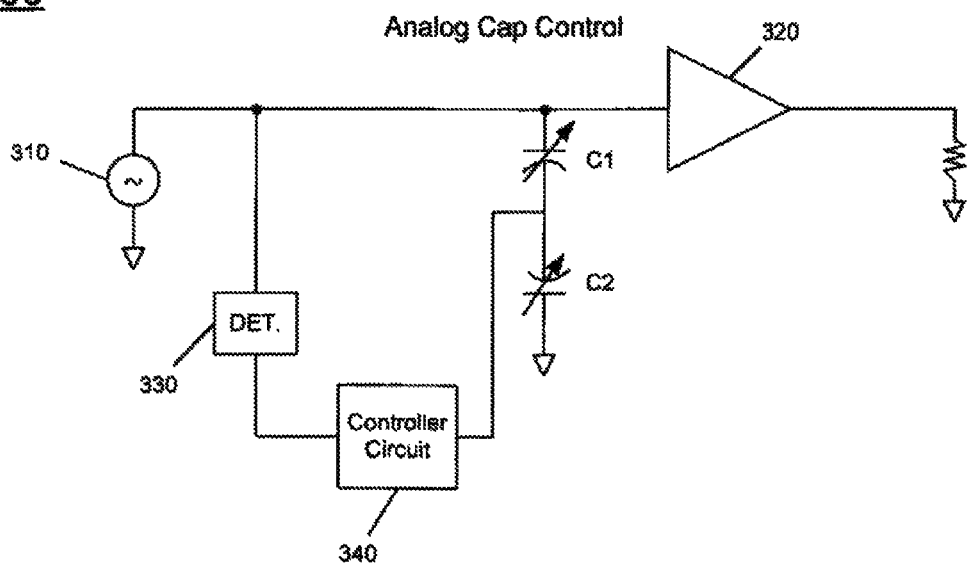
FIG. 7B is a schematic diagram of a closed loop system in accordance with another embodiment of the present invention.

In other implementations, rather than an open loop approach, a closed loop system can be provided to obtain feedback regarding a level of an incoming signal and adjust a controllable element to provide a desired amount of capacitance to the gain device. Referring now to FIG. 7A, shown is a schematic diagram of a closed loop system in accordance with one embodiment of the present invention. As shown in FIG. 7A, system 300 includes a signal source 310, which may be a portion of a handset through a transceiver that thus provides an RF signal to an amplifier 320, such as a gain stage of a PA of the handset. To enable capacitance compensation in accordance with an embodiment of the present invention, a detector 330, which may be an amplitude detector (e.g., a RMS or peak detector) may be coupled to detect an amplitude of the incoming signal. In various embodiments, the amplitude detected may be a voltage amplitude or current amplitude. This detected amplitude may be provided to a controller 340, which may be an analog or digital control circuit, either present within a PA, or part of other circuitry of a handset or other device. Based on the input level, control signals may be provided to variable capacitors C1 and C2 to thus switch in a desired amount of capacitance to the input of amplifier 320. As one example, controller 340 may include a lookup table that is coupled to receive as an input the amplitude of the signal and to output a control value to capacitor C1 and/or C2 to thus switch in the desired amount of capacitance (which may be a negative value, in some implementations). The values present in the lookup table may be generated based on empirical analysis, small signal modeling or so forth. In various implementations, the variable capacitors can be a bank of discrete fixed capacitors with digital control. Alternately, in other implementations in a system 300, such as shown in FIG. 7B, the controllable capacitances can be varactors with analog control.

In operation, a closed loop system may provide capacitance compensation as follows. First, the input signal amplitude may be detected, and an amount of capacitance to be coupled to the gain stage may be determined responsive to this detected amplitude. Note that this capacitance thus may compensate for a non-linear phase response of the gain stage to the input signal. Then, based on the determined capacitance, the controllable element, which can be a variable capacitance, a varactor with analog control or so forth, can be controlled to couple the determined amount of capacitance to the gain stage.

Figure 8:
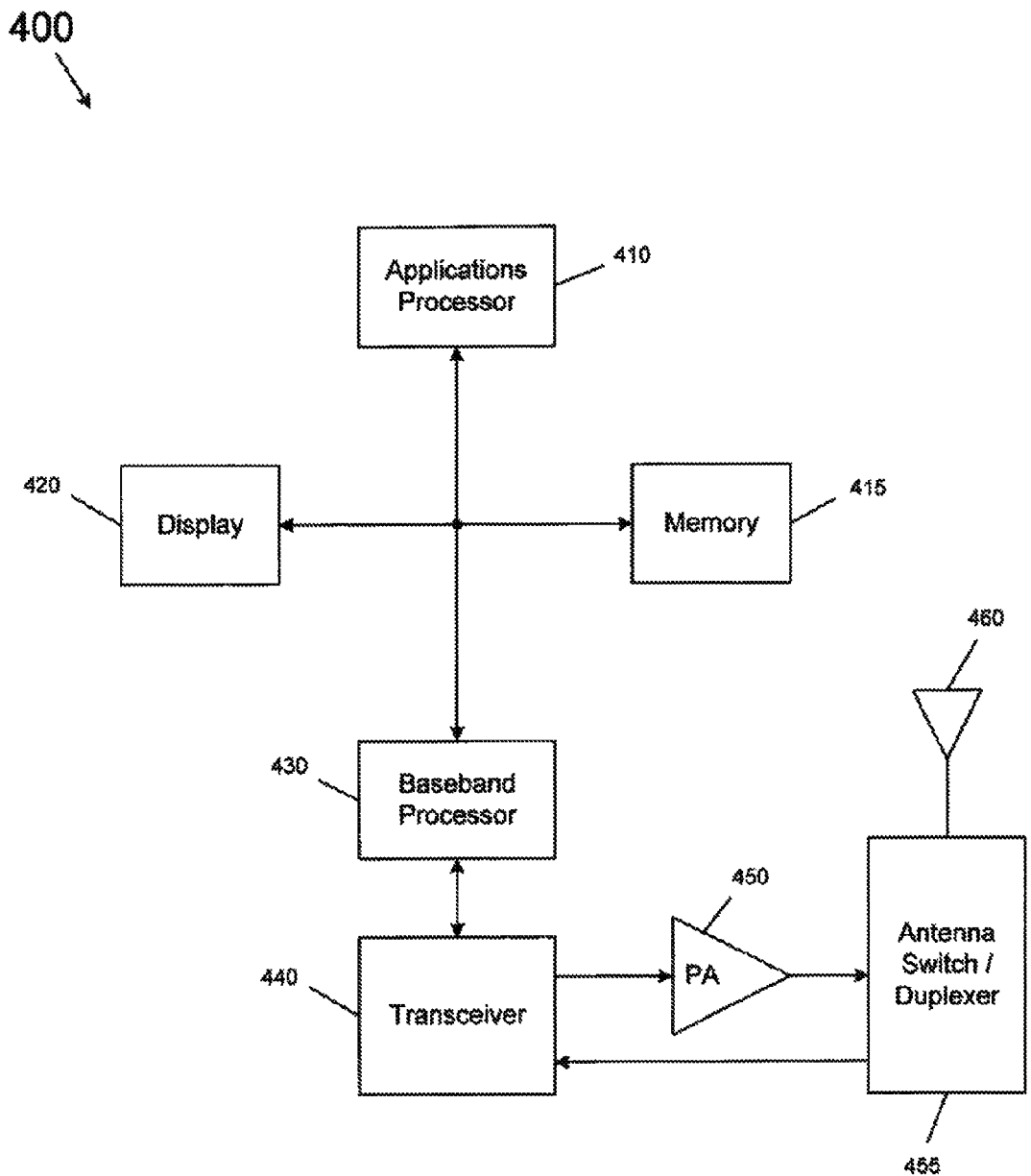
FIG. 8 is a block diagram of a wireless device in accordance with an embodiment of the present invention.

As described above, compensation circuitry in accordance with an embodiment of the present invention can be implemented in a PA such as a CMOS PA. Such a device can be used in various wireless systems, including handsets, mobile devices, PDAs and so forth. Referring, now to FIG. 8, shown is a block diagram of a wireless device 400 in accordance with an embodiment of the present invention. As shown in FIG. 8, wireless device 400 may include an applications processor 410 which may be a microprocessor or other programmable logic to handle various system features, such as running application programs desired by a user. To perform its functions, applications processor 410 may communicate with a memory 415, which may be a flash memory or other non-volatile memory. Applications processor 410 may further communicate with a display 420, such as an LCD display of the system. For handling RF communications, e.g., wireless phone calls, wireless data transmissions and so forth, e.g., according to a W-CDMA protocol, applications processor 410 may communicate with a baseband processor 430, which may handle baseband operations both for transmit and receive paths. In turn, baseband processor 430 is coupled to a transceiver, which may receive incoming baseband signals from baseband processor 430, and perform processing to upconvert the signals to RF levels for transmission to a PA 450. PA 450 may be a power amplifier in accordance with an embodiment of the present invention that includes one or more gain stages having capacitor compensation circuitry as described above. In turn, PA 450 may be coupled to an antenna switch, duplexer or both 455 which in turn is coupled to an antenna 460, which radiates the amplified RF signal.

In a receive path, antenna 460 couples through antenna switch 455 and possibly through the duplexer or SAW filters and then to transceiver 440, which may demodulate the incoming RF signals back to baseband for transmission to baseband processor 430 for further processing. While shown with this particular implementation in the embodiment of FIG. 8, the scope of the present invention is not limited in this regard.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A power amplifier comprising:
    a gain stage having first and second complementary amplifiers, the gain stage to receive a differential input signal on a differential input line and to output a differential amplified signal;
    a first compensation stage having a first compensation device coupled to a first amplifier of the first complementary amplifier and a second compensation device coupled to a first amplifier of the second complementary amplifier; and
    a second compensation stage having a first compensation device coupled to a second amplifier of the first complementary amplifier and a second compensation device coupled to a second amplifier of the second complementary amplifier, wherein each compensation device is to compensate for a change in capacitance of the corresponding amplifier when the differential input signal is in a predetermined transition region of an input range.

2. The power amplifier of claim 1, wherein the first compensation stage is formed in a well and is driven differentially.

3. The power amplifier of claim 2, further comprising a bias generator to provide a bias voltage to the first and second compensation devices of the first compensation stage, and wherein a return current of the first compensation device is to travel through the second compensation device.

4. The power amplifier of claim 1, wherein each compensation device is of opposite polarity to the amplifier to which it is coupled.

5. The power amplifier of claim 1, wherein the first compensation stage comprises a pair of n-channel metal-oxide-semiconductor (NMOS) transistors.

6. The power amplifier of claim 1, wherein the second compensation stage comprises a pair of p-channel metal-oxide-semiconductor (PMOS) transistors.

7. The power amplifier of claim 5, wherein the NMOS transistors of the first compensation stage are driven differentially.

8. The power amplifier of claim 6, wherein the PMOS transistors of the second compensation stage are driven differentially.

9. The power amplifier of claim 1, further comprising:
    a first bias generator configured to provide a first bias voltage to the first and second compensation devices of the first compensation stage; and
    a second bias generator configured to provide a second bias voltage to the first and second compensation devices of the second compensation stage.

10. The power amplifier of claim 9, wherein a return current of the first compensation device of the first compensation stage is to travel through the second compensation device of the first compensation stage.

11. The power amplifier of claim 9, wherein a return current of the first compensation device of the second compensation stage is to travel through the second compensation device of the second compensation stage.

* * * * *